(12) United States Patent
Moser et al.

(10) Patent No.: US 7,276,896 B2
(45) Date of Patent: Oct. 2, 2007

(54) TEST APPARATUS AND METHOD FOR TESTING CIRCUIT UNITS TO BE TESTED

(75) Inventors: Manfred Moser, Dachau (DE); Daniel Mysliwitz, Munich (DE); Erwin Thalmann, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/145,610

(22) Filed: Jun. 6, 2005

(65) Prior Publication Data

US 2005/0280410 A1 Dec. 22, 2005

(30) Foreign Application Priority Data

Jun. 8, 2004 (DE) ...................... 10 2004 027 854

(51) Int. Cl.
*G01R 31/28* (2006.01)
*G01R 31/26* (2006.01)
(52) U.S. Cl. .................................... 324/158.1; 324/765
(58) Field of Classification Search ................ 324/765, 324/158.1
See application file for complete search history.

(56) References Cited

U.S. PATENT DOCUMENTS 6,525,555 B1 * 2/2003 Khandros et al. ........... 324/765

2005/0068210 A1 * 3/2005 Lin ............................ 341/120

FOREIGN PATENT DOCUMENTS

DE 10202904 9/2003
WO WO99/23501 5/1999

OTHER PUBLICATIONS

German Office Action dated Mar. 1, 2005.

* cited by examiner

*Primary Examiner*—Ha Tran Nguyen
*Assistant Examiner*—Roberto Velez
(74) *Attorney, Agent, or Firm*—Jenkins, Wilson, Taylor & Hunt, P.A.

(57) ABSTRACT

The invention provides a test apparatus for testing a circuit unit (101) to be tested having a test system (100), a control bus (102) for transferring control data (106), an address bus (103) for transferring addressing data (107) and a data bus (104) for exchanging test data (108) between the test system (100) and the circuit unit (101) to be tested. A voltage generating device (200) connected between the test system (100) and the circuit unit (101) to be tested serves for generating a predeterminable operating voltage output signal (202, 202a-202n) for the voltage supply of the circuit unit (101) to be tested in a manner dependent on a control signal (211) that is provided by the test system (100) and fed via the control bus (102).

13 Claims, 4 Drawing Sheets

TEST APPARATUS AND METHOD FOR TESTING CIRCUIT UNITS TO BE TESTED

TECHNICAL FIELD

The present invention generally relates to a testing of electronic devices such as, for example, memory modules (chips), test systems having high throughput numbers being used for such a test during the production of the electronic devices.

BACKGROUND ART

In particular, the present invention relates to a test apparatus for testing a circuit unit to be tested having a test system, a control bus for transferring control data from the test system to the circuit unit to be tested, an address bus for transferring addressing data from the test system to the circuit unit to be tested, and a data bus for exchanging test data between the test system and the circuit unit to be tested.

Present-day test systems preferably use an advanced test load (ATE). Test systems of this type make it possible to test electronic circuit units to be tested at a high throughput (throughput numbers) and furthermore to prescribe different parameters such as, for example, different operating voltages for the circuit unit to be tested or different timings of the test data streams.

FIG. 4 shows a conventional test apparatus in which a circuit unit DUT (DUT=Device Under Test) to be tested can be tested by means of a test system. In the schematic block diagram of a conventional test apparatus as shown in FIG. 4, control signals for controlling a test sequence are fed to the circuit unit DUT to be tested via a control bus. Furthermore, specific circuit subunits or memory cells are addressed by means of addressing signals from the test system, the addressing signals being fed via an address bus illustrated.

A data bus is provided between the test system and the circuit unit DUT to be tested in order to exchange test data. Thus, by way of example, desired data are compared, in the test system, with actual data fed from the circuit unit to be tested during a test sequence.

If circuit units to be tested are connected to the test system in a conventional test apparatus, then a ground line for the connection of the ground potential VSS is furthermore present, while an operating voltage line for feeding an operating voltage potential VDD is provided.

Particularly in advanced test apparatuses, it is increasingly of importance to change the operating voltage that is fed during the test, i.e. to prescribe an operating voltage signal in variable fashion. It is disadvantageous that conventional test systems do not enable changes to be made in the operating voltage VDD at an arbitrary point in time. If it is necessary, for example, at an exactly defined point in time, for example after a specific command fed via the control bus, to carry out a voltage change for a specific time, then it is inexpedient that this procedure cannot be carried out by means of conventional test systems. In conventional circuit arrangements, this leads to the essential disadvantage that operating voltage changes such as possibly occur in a subsequent application cannot be simulated by the test system of the test apparatus. Consequently, it is disadvantageous that an extremely low test coverage is achieved in this respect.

In order to carry out changes in the operating voltage VDD, it is necessary, in conventional test systems, to halt a test that is underway, to change the voltage and to continue the test after a transient response. Consequently, operating voltage changes for the circuit unit DUT to be tested can only be carried out in relatively long time periods that cannot be predetermined in variable fashion.

SUMMARY OF THE INVENTION

Therefore, it is an object of the present invention to provide a test apparatus in which an operating voltage of the circuit unit to be tested in the test apparatus can be changed predeterminably in variable fashion at an arbitrary point of time.

This object is achieved by means of a test apparatus for testing a circuit unit to be tested having the features of Patent Claim 1.

Furthermore, the object is achieved by means of a test method specified in Patent Claim 8.

Further refinements of the invention emerge from the subclaims.

The heart of the invention consists in providing a voltage generating device between a test system and the circuit unit to be tested within the test apparatus. In this case, in an advantageous manner, only the voltage supply line between the test system and the circuit unit to be tested is interrupted, the voltage generating device being connected to the test system, on the one hand, and to the circuit unit to be tested, on the other hand. By means of the control units provided within the voltage generating device and a multiplexing unit provided at the output of the voltage generating device, it is then advantageously possible to apply either the originally provided operating voltage generated by the test system or the operating voltage generated by the interposed voltage generating device to the circuit unit to be tested. Furthermore, it is possible to alter the ground potential of the circuit unit to be tested relative to the ground potential of the test system.

In particular, the test apparatus according to the invention enables voltage changes to be carried out in an expedient manner after a specific command that is passed for example via the control bus from the test system to the circuit unit to be tested. This makes it possible for voltage changes that occur in the application after a specific command to be simulated on test systems in production. The voltage generating device according to the invention is thus a manipulation stage which can prescribe voltage changes in an exactly defined state in a manner dependent on a trigger signal fed via the control lines.

The invention's voltage generating device connected between the test system and the circuit unit to be tested makes it possible to change the supply voltage (operating voltage potential, operating voltage signal) of the circuit unit to be tested in real time. Consequently, in an expedient manner, it is possible to provide changes in the operating voltage during a test sequence without the need for a time-noncritical state during a test sequence.

Furthermore, the test apparatus according to the invention makes it possible to adapt voltage changes and points in time of voltage changes to different, later applications of the circuit unit to be tested. Consequently, a high test coverage is expediently achieved.

In an advantageous manner, it is not necessary for the supply voltage (operating voltage) supplied by the test system to be changed.

The test apparatus according to the invention for testing a circuit unit to be tested essentially has:

a) a test system;

b) a control bus for transferring control data from the test system to the circuit unit to be tested;

c) an address bus for transferring addressing data from the test system to the circuit unit to be tested; and d) a data bus for exchanging test data between the test system and the circuit unit to be tested, the test apparatus furthermore having a voltage generating device connected between the test system and the circuit unit to be tested and serving for generating a predeterminable operating voltage signal for the voltage supply of the circuit unit to be tested in a manner dependent on a control signal that is provided by the test system and fed via the control bus.

Furthermore, the method according to the invention for testing a circuit unit to be tested by means of a test system essentially has the following steps:

a) transfer of control data from the test system to the circuit unit to be tested via a control bus;

b) transfer of addressing data from the test system to the circuit unit to be tested via an address bus; and c) exchange of test data between the test system and the circuit unit to be tested via a data bus, provision being made of a control signal for the modification of an operating voltage of the circuit unit to be tested, the control signal being passed via the control bus to a voltage generating device connected between the test system and the circuit unit to be tested, and there being generated a predeterminable operating voltage output signal for the voltage supply of the circuit unit to be tested in a manner dependent on the control signal that is provided by the test system and fed via the control bus, by means of the voltage generating device connected between the test system and the circuit unit to be tested.

Advantageous developments and improvements of the respective subject-matter of the invention are found in the subclaims.

In accordance with one preferred development of the present invention, the voltage generating device connected between the test system and the circuit unit to be tested provides a ground output potential in a manner dependent on the control signal. Preferably, it is thus possible to vary the ground potential of the circuit unit to be tested relative to the ground potential of the test system during the test, i.e. the advantage consists in a flexible setting of the ground potential of the circuit unit to be tested.

In accordance with a further preferred development of the present invention, the voltage generating device has a triggering unit for triggering changes in the operating voltage output signal. Such a triggering unit is advantageously designed such that it continuously checks whether a specific trigger condition applies. In the event of a match, a trigger signal is output.

In accordance with yet another preferred embodiment of the present invention, the voltage generating device has a storage unit for storing a sequence of digital voltage setting values. Preferably, the storage unit for storing the sequence of digital voltage setting values is designed in software terms as a look-up table LUT. Preferably, a desired sequence of operating voltage values that are to be fed to the circuit unit to be tested is stored in digital form in the look-up table.

In accordance with yet another preferred development of the present invention, the voltage generating device has a converter unit for converting the digital voltage setting values stored in the storage unit into a corresponding analog operating output signal.

Preferably, the circuit unit to be tested can thus be fed either the converted analog operating voltage output signal of the voltage generating device or the supply voltage originally provided by the test system.

In accordance with yet another preferred development of the present invention, the voltage generating device has a multiplexing unit for changing over between an operating voltage signal fed by the test system and the analog operating voltage signal output by the converter unit.

In accordance with yet another preferred development of the present invention, the voltage generating device has a control unit for addressing the storage unit of the voltage generating device with cyclically recurring addresses corresponding to the sequence of digital voltage setting values in the storage unit.

In accordance with yet another preferred development of the present invention, a sequence of digital voltage setting values is stored in the storage unit provided in the voltage generating device, for example a look-up table.

In accordance with yet another preferred development of the present invention, the predeterminable operating voltage output signal is altered by means of the voltage generating device connected between the test system and the circuit unit to be tested in a manner dependent on the control signal provided by the test system during a test operation of the circuit unit to be tested.

In accordance with yet another preferred development of the present invention, changes in the operating voltage output signal are carried out by means of the voltage generating device during a read command fed to the circuit unit to be tested via the control bus.

In accordance with yet another preferred development of the present invention, different operating voltage output signals are set with the control signal fed to the voltage generating device via the control bus in order to feed a varying operating voltage to the circuit unit to be tested during a test.

Exemplary embodiments of the invention are illustrated in the drawings and explained in more detail in the description below.

DETAILED DESCRIPTION OF THE INVENTION

In the figures, identical reference symbols designate identical or functionally identical components or steps.

Figure 1:
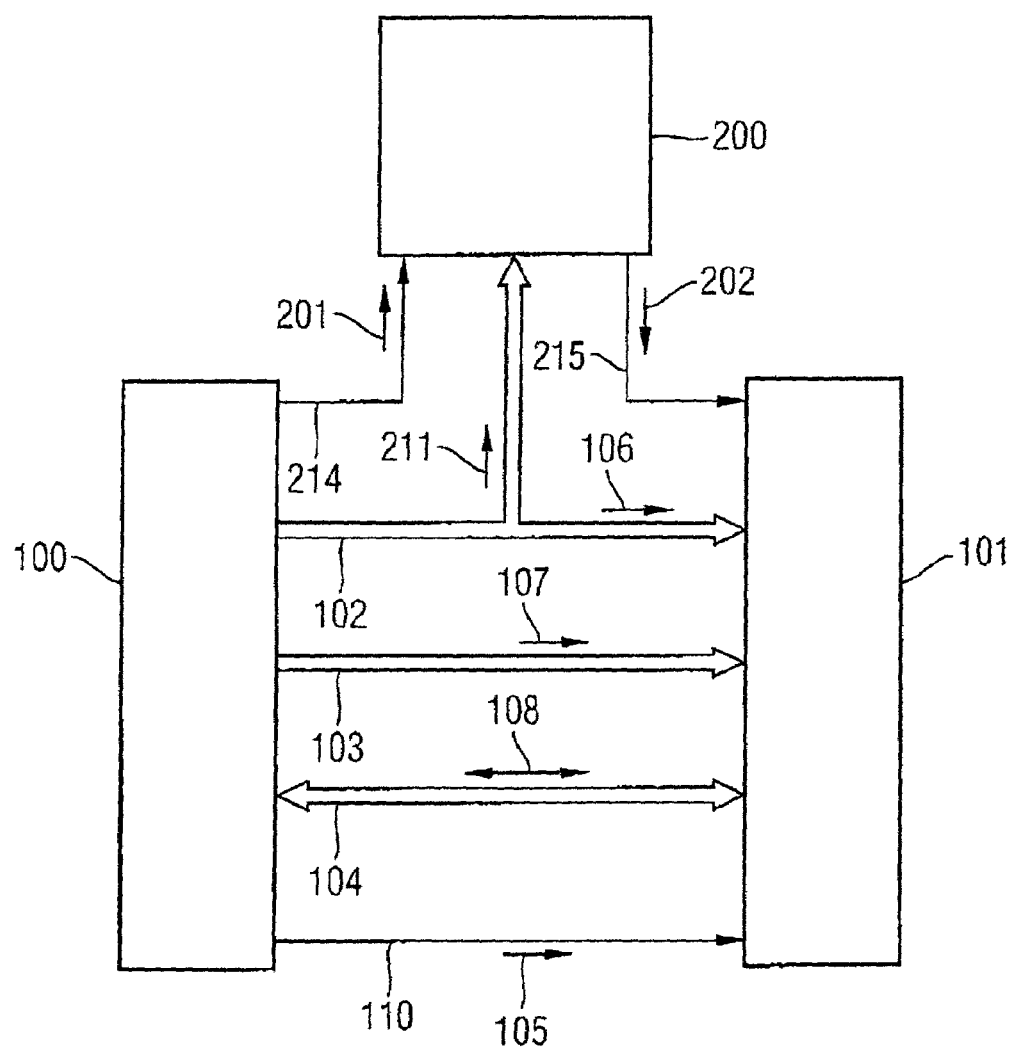
FIG. 1 shows a block diagram of a test apparatus with a voltage generating device in accordance with one preferred exemplary embodiment of the present invention.

FIG. 1 illustrates a test apparatus according to the invention with a block diagram. A reference symbol 100 designates a test system and a reference symbol 101 designates a circuit unit to be tested that is connected to the test system. It should be pointed out that, in principle, a large number of circuit units 101 to be tested can be tested with the test system; only one circuit unit 101 to be tested is shown here by way of example in order to simplify the illustration. The circuit unit 101 to be tested is connected to the test system 100 via a control bus 102, an address bus 103 and a data bus 104. Via the control bus 102, control data 106 for controlling the test sequence, etc. are fed to the circuit unit 101 to be tested from the test system 100. The address bus 103 serves for transferring addressing data 107 from the test system 100 to the circuit unit 101 to be tested, in which case, particularly when the circuit unit 101 to be tested is a memory module, the addressing data are used for addressing memory cells.

Furthermore, the data bus 104 serves for exchanging test data 108 between the test system 100 and the circuit unit 101 to be tested.

It is known to the average person skilled in the art that, in particular, test data 108 are exchanged via the data bus 104 between the test system 100 and the circuit unit 101 to be tested, which test data are intended to verify an error-free operation of the circuit unit 103 to be tested under different test conditions. Thus, it is possible, for example, to provide desired data from the test system 100, which are compared with actual data that are output by the circuit unit 101 to be tested during a test sequence. It is known to the average person skilled in the art to change various parameters during a test sequence. In particular, the test apparatus according to the invention makes it possible to modify the operating voltage (supply voltage) of the circuit unit 101 to be tested during a test sequence. In this respect, FIG. 1 shows that a voltage generating device 200 is connected between a power supply input line 214 and a power supply output line 215. In a conventional test system as shown for example in FIG. 4 and described above, the power supply input line 214 is always fixedly connected to the power supply output line 215 in such a way that an operating voltage signal output by the test system 100 is fed directly to the circuit unit 101 to be tested.

A feeding of the operating voltage signal output by the test system 100 is also still possible in the test apparatus according to the invention. Moreover, the interposed voltage generating device 200 affords the possibility of prescribing arbitrary operating voltages, i.e. arbitrary operating voltage output signal 202, 202a-202n, at arbitrary points in time. For this purpose, a control signal 210 is furthermore fed to the voltage generating device 200 via the control bus 102. The control signal 210 may be fed to the voltage generating device 200 either by the test system 100 or by the circuit unit 101 itself that is to be tested. In a manner dependent on the control signal, the voltage generating device 200 generates different operating voltage output signals 202a-202n in accordance with a predetermined test mode, as will be explained below with reference to FIG. 2.

In the test apparatus illustrated in FIG. 1, the ground potential of the circuit unit 101 to be tested is fixedly prescribed by the ground potential of the test system 100 since the circuit unit 101 to be tested and the test system 100 are fixedly coupled with regard to the ground potential 105 via a ground line 110. However, it is also possible, in addition to setting and freely prescribing the operating voltage output signal, to prescribe a ground output potential 213 for the circuit unit 101 to be tested in variable fashion, as will be explained below with reference to FIG. 3.

As shown in FIG. 1, the voltage generating device 200 receives the operating voltage input signal via the power supply input line, while the operating voltage output signal 202, 202a-202n is output via the power supply output line 215 to the circuit unit 101 to be tested.

Figure 2:
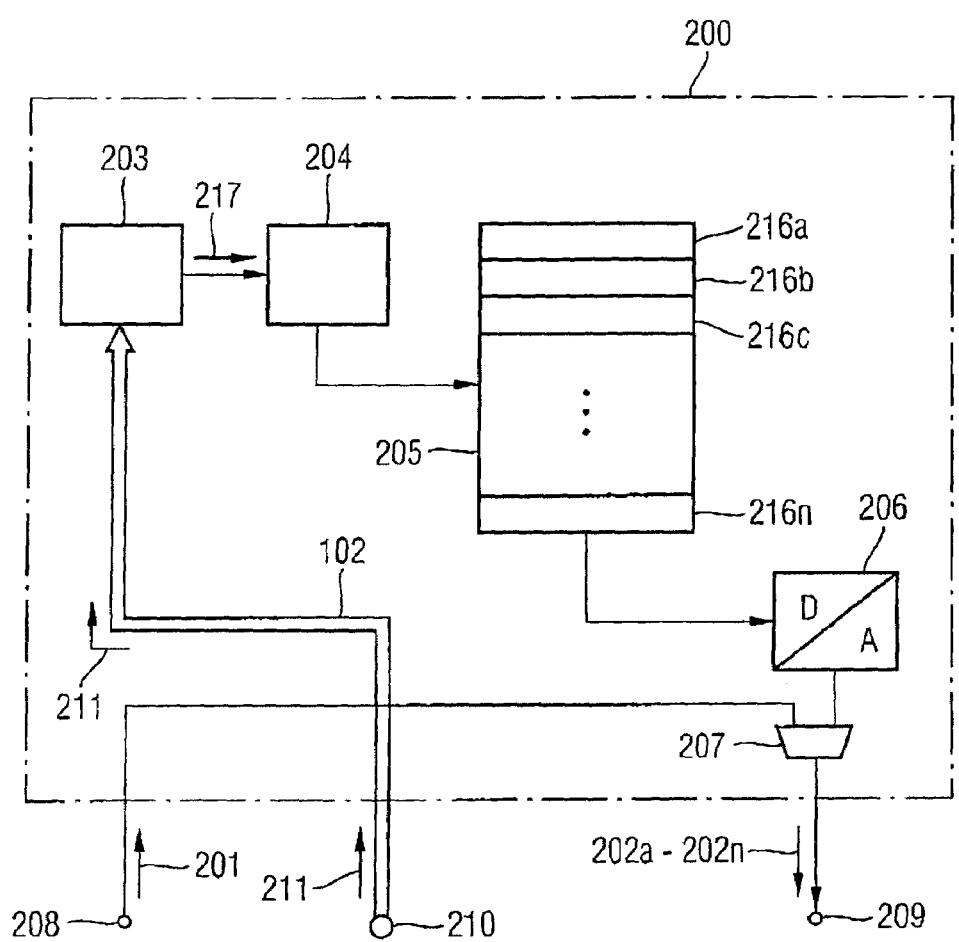
FIG. 2 shows the voltage generating device used in the test apparatus of FIG. 1 in greater detail.

FIG. 2 shows the voltage generating device 200 connected between the test system 100 and the circuit unit 101 to be tested of FIG. 1 in greater detail.

As illustrated in FIG. 2, the operating voltage input signal 201 is fed to the voltage generating device 200 via a voltage signal input 208, while the operating voltage output signal 202a-202n can be tapped off via the voltage signal output 209 and be fed to the circuit unit 101 to be tested.

The control signal 211 provided via the control bus 102 (FIG. 1) is likewise fed to the voltage generating device 200. In this case, the control signal serves in particular for triggering the voltage generating device 200 in such a way that the operating voltage output signals 202a-202n are altered. With the aid of the voltage generating device 200, it is possible, then, to alter the supply voltage of the circuit unit 101 to be tested without the test system 100 itself having to perform a voltage change. By means of the control signal 211 (trigger signal), a triggering instant is prescribed for the voltage generating device 200 in variable fashion at a defined state. It is preferably possible to carry out a change of operating voltage output signals 202a-202n by means of the voltage generating device 200 during a read command that is fed to the circuit unit 101 to be tested via the control bus 102.

In order to simulate voltage fluctuations in real time, it is furthermore possible to assign a plurality of different voltage values to a control signal 211.

The voltage generating device 200 shown in FIG. 2 has, as an essential element, a storage unit 205, in which digital voltage setting values 216a-216n can be stored. Preferably, the digital voltage setting values 216a-216n are stored in software terms in the form of a look-up table (LUT). By way of example, such a storage unit 205 formed as a look-up table makes it possible to store a desired sequence of changes in the operating voltage output signal 202a-202n in a digital form. In this case, a converter unit 206 connected downstream of the storage unit 205 serves to convert the digital voltage setting values 216a-216n into corresponding analog operating voltage output signals 202a-202n.

It should be pointed out that an arbitrary number n of voltage setting values can be provided in a manner dependent on the storage depth of the storage unit 205. Consequently, it is evident to the average person skilled in the art that a corresponding number of analog operating voltage output signals 202a-202n can be obtained. The output signal of the converter unit 206 is conducted via a multiplexing unit 207 before being passed to the voltage signal output 209 of the voltage generating device 200. As illustrated in FIG. 2, the multiplexing unit 207 is furthermore fed the operating voltage input signal 201 applied via the voltage signal input 208. By means of a changeover of the multiplexing unit 207, which may be provided as a simple electronic changeover switch, it is thus possible to feed to the voltage signal output either the original operating voltage input signal 201 provided by the test system 100 or the operating voltage output signal 202a-202n output by the converter unit 206.

Consequently, it is possible to choose between the original supply voltage supplied by the test system and a supply voltage supplied by the voltage generating device according to the invention. A desired trigger condition, for example a trigger condition such as a DRAM (Dynamic Random Access Memory) command, may be stored in a triggering unit 203 provided in the voltage generating device 200. The triggering unit 203 then continuously checks whether or not the trigger condition stored in the triggering unit 203 is met. If a match in the control signal 210 that is fed to the triggering unit 203 via the control bus input 210 is ascertained, then a control unit 204 connected downstream in the voltage generating device 200 is started. The control unit 204 provides a generation of an item of addressing information for the addressing of the storage unit 205 designed as a look-up table.

After the control unit 204 has been started by the triggering unit 203, all the addresses of the storage unit 204 are applied to the storage unit 205 in cyclically recurring fashion, beginning with the lowest address and ending with the highest address in the preferred exemplary embodiment of the present invention. The stored digital voltage setting values 216a-216n are then fed to the converter unit 206, which is designed as a digital/analog converter (D/A) for example. The converter unit 206 subsequently generates the corresponding operating voltage output signals 202a-202n, as explained above. The operating voltage output signals 202a-202n thus correspond to the supply voltage (VDD) of the circuit unit to be tested.

In accordance with a preferred exemplary embodiment of the invention, it is possible to effect a change in the addressing of the storage unit 205 designed as a look-up table with an operating frequency of the circuit unit to be tested, said change being carried out in the voltage generating device 200 with the aid of the control unit 204. In this way, a smallest temporal resolution of a voltage change of the operating voltage output signal 202, 202a-202n is simultaneously defined. A gradation of the operating voltage output signal 202, 202a-202n generated is defined by a data bus width of the storage unit 205. It is known to average persons skilled in the art how a sequence of a change of an operating voltage output signal 202, 202a-202n can be stored as digital voltage setting values 216a-216n in the storage unit 205.

Figure 3:
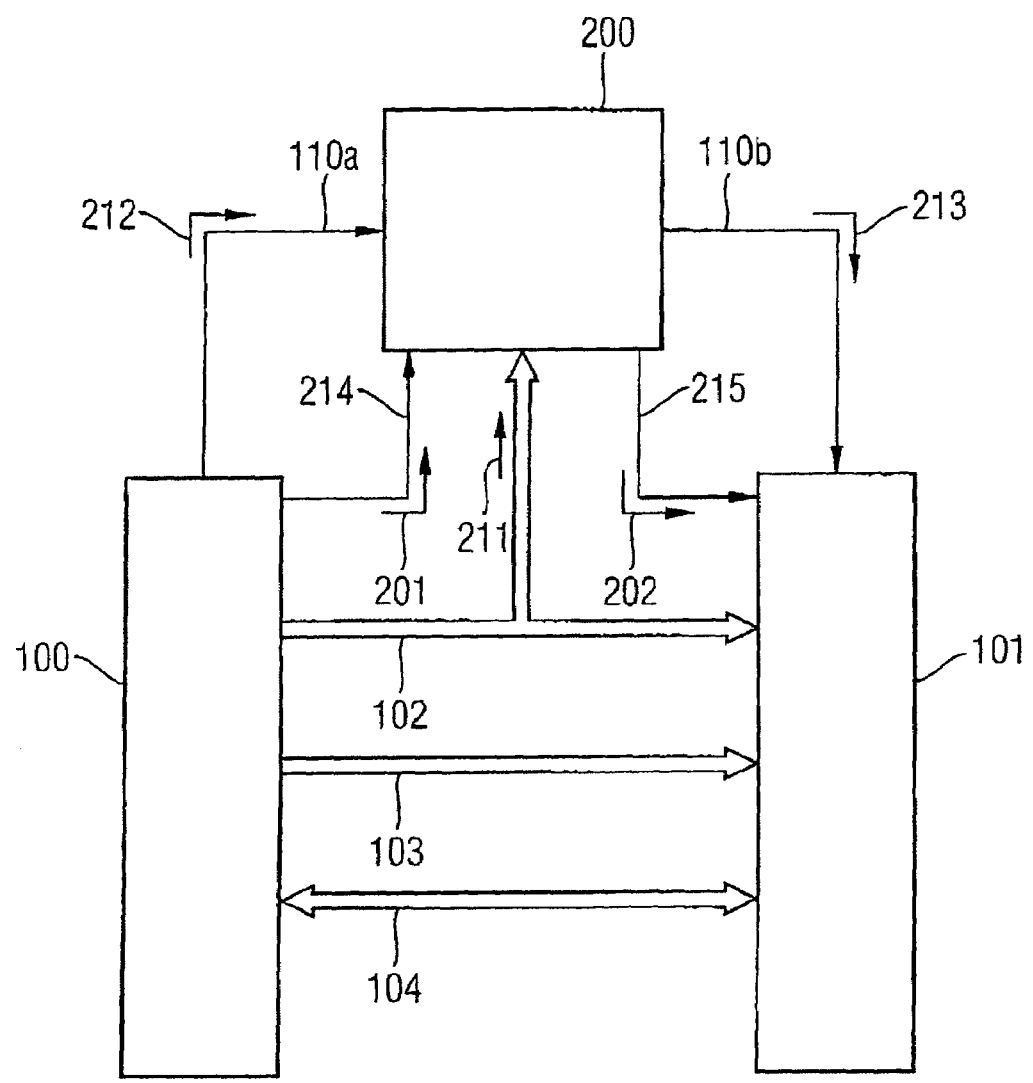
FIG. 3 shows a test apparatus in accordance with a further preferred exemplary embodiment of the present invention.

FIG. 3 shows a test apparatus for testing a circuit unit 101 to be tested by means of a test system 100 in accordance with a further preferred exemplary embodiment of the present invention.

Identical reference symbols as used in the test apparatus shown in FIG. 1 designate identical or functional identical components, the elucidation of which is omitted here in order to avoid an overlapping description.

As shown in FIG. 3, the voltage generating device 200 is fed a ground input potential 212 in addition to the operating voltage input signal 201. A corresponding ground output potential 213 is then fed to the circuit unit 101 to be tested. The ground line 110 shown in FIG. 1 is divided into two ground partial lines 110a, 110b. In this way it is possible for a ground potential of the circuit unit 101 to be tested to be prescribed in variable fashion with regard to the ground potential of the test system 100. In this case, the setting of different ground output potentials 213 may be effected in a similar manner to a setting of different operating voltage output signals 202a-202n, as described above with reference to FIG. 2.

Figure 4:
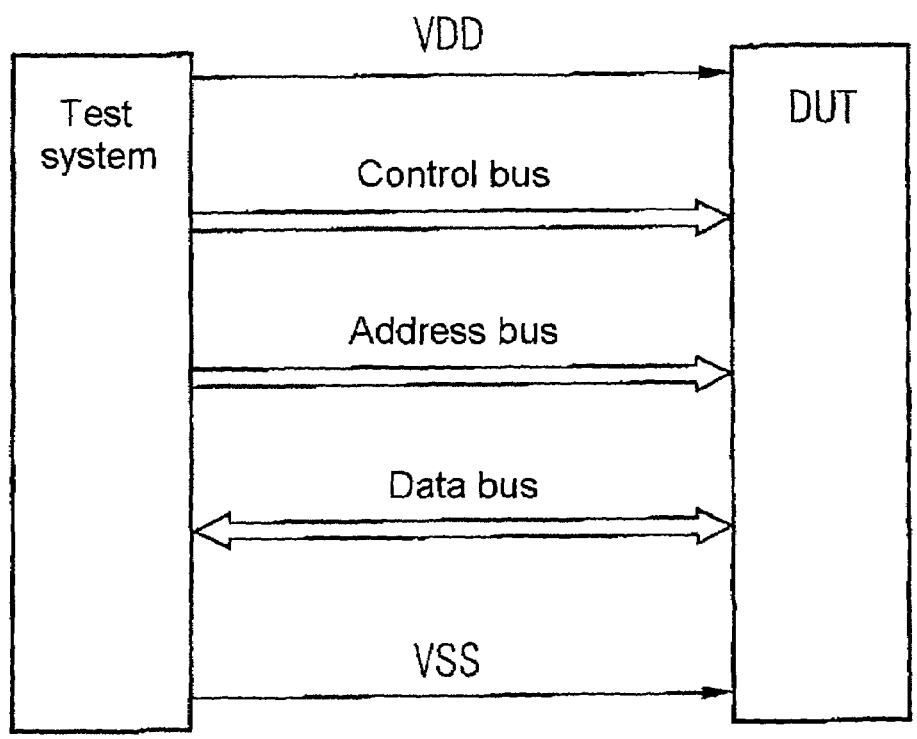
FIG. 4 shows a conventional test apparatus.

With regard to the conventional test apparatus for testing circuit units to be tested as illustrated in FIG. 4, reference is made to the introduction to the description.

Although the present invention has been described above on the basis of preferred exemplary embodiments, it is not restricted thereto, but rather can be modified in diverse ways.

Moreover, the invention is not restricted to the application possibilities mentioned.

List of Reference Symbols

In the figures, identical reference symbols designate identical or functionally identical components or steps.

| | |
|---|---|
| 100 | Test system |
| 101 | Circuit unit to be tested |
| 102 | Control bus |
| 103 | Address bus |
| 104 | Data bus |
| 105 | Ground potential |
| 106 | Control data |
| 107 | Addressing data |
| 108 | Test data |
| 109 | Power supply line |
| 110 | Ground line |
| 200 | Voltage generating device |
| 201 | Operating voltage input signal |
| 202, 202a-202n | Operating voltage output signal |
| 203 | Triggering unit |
| 204 | Control unit |
| 205 | Storage unit |
| 206 | Converter unit |
| 207 | Multiplexing unit |
| 208 | Voltage signal input |
| 209 | Voltage signal output |
| 210 | Control bus input |
| 211 | Control signal |
| 212 | Ground input potential |
| 213 | Ground output potential |
| 214 | Power supply input line |
| 215 | Power supply output line |
| 216a-216n | Digital voltage setting value |
| 217 | Triggering signal |

What is claimed is:

1. Test apparatus for testing a circuit unit to be tested, having:
   a) a test system;
   b) a control bus for transferring control data from the test system to the circuit unit to be tested;
   c) an address bus for transferring addressing data from the test system to the circuit unit to be tested; and
   d) a data bus for exchanging test data between the test system and the circuit unit to be tested, wherein the test apparatus furthermore has:
   e) a voltage generating device connected between the test system and the circuit unit to be tested and serving for generating a predeterminable operating voltage output signal for the voltage supply of the circuit unit to be tested in a manner dependent on a control signal that is provided by the test system and fed via the control bus;
   f) wherein the voltage generating device connected between the test system and the circuit unit to be tested provides a ground output potential in a manner dependent on the control signal such that the ground potential of the circuit unit to be tested can be varied relative to a ground potential of the test system.

2. Apparatus according to claim 1 wherein the voltage generating device has a triggering unit for triggering changes in the operating voltage output signal.

3. Apparatus according to claim 2, wherein the voltage generating device has a control unit for addressing the storage unit of the voltage generating device with cyclically recurring addresses corresponding to the sequence of digital voltage setting values in the storage unit.

4. Apparatus according to claim 1 wherein the voltage generating device has a storage unit for storing a sequence of digital voltage setting values.

5. Apparatus according to claim 4, wherein the voltage generating device has a converter unit for converting the digital voltage setting values stored in the storage unit into analog operating voltage output signals.

6. Apparatus according to claim 5, wherein the voltage generating device has a multiplexing unit for changing over between an operating voltage input signal fed by the test system and the analog operating voltage output signal output by the converter unit.

7. Test method for testing a circuit unit to be tested by means of a test system, having the following steps:
 a) transferring of control data from the test system to the circuit unit to be tested via a control bus;
 b) transferring of addressing data from the test system to the circuit unit to be tested via an address bus; and
 c) exchanging of test data between the test system and the circuit unit to be tested via a data bus, wherein the test method furthermore has the steps of:
 d) providing a control signal for the modification of an operating voltage of the circuit unit to be tested;
 e) feeding the control signal via the control bus to a voltage generating device connected between the test system and the circuit unit to be tested; and
 f) generating a predeterminable operating voltage output signal for the voltage supply of the circuit unit to be tested in a manner dependent on the control signal that is provided by the test system and fed via the control bus, by means of the voltage generating device connected between the test system and the circuit unit to be tested
 g) wherein a predeterminable ground output potential is provided by means of the voltage generating device connected between the test system and the circuit unit to be tested in a manner dependent on the control signal such that the ground potential of the circuit unit to be tested can be varied relative to a ground potential of the test system.

8. Method according to claim 7, wherein changes in the operating voltage output signal are triggered by means of a triggering unit provided in the voltage generating device.

9. Method according to claim 7, wherein a sequence of digital voltage setting values is stored in a storage unit provided in the voltage generating device.

10. Method according to claim 9, wherein the digital voltage setting values stored in the storage unit of the voltage generating device are addressed with cyclically recurring addresses by means of a control unit provided in the voltage generating device.

11. Method according to claim 7, wherein the predeterminable operating voltage output signal is altered by means of the voltage generating device connected between the test system and the circuit unit to be tested in a manner dependent on the control signal provided by the test system during a test operation of the circuit unit to be tested.

12. Method according to claim 7, wherein changes in the operating voltage output signal are carried out by means of the voltage generating device during a read command fed to the circuit unit to be tested via the control bus.

13. Method according to claim 7, wherein different operating voltage output signals are set with the control signal fed to the voltage generating device via the control bus in order to feed a varying operating voltage to the circuit unit to be tested during a test.

* * * * *